United States Patent [19]

Kawabe et al.

[11] Patent Number: 5,340,688

[45] Date of Patent: Aug. 23, 1994

[54] POSITIVE TYPE PHOTORESIST COMPOSITION

[75] Inventors: Yasumasa Kawabe; Toshiaki Aoai; Tadayoshi Kokubo, all of Shizuoka, Japan

[73] Assignee: Fuji Photo Film Co., Ltd., Kanagawa, Japan

[21] Appl. No.: 15,578

[22] Filed: Feb. 10, 1993

[30] Foreign Application Priority Data

Feb. 12, 1992 [JP] Japan .................. 4-025158

[51] Int. Cl.$^5$ .................. G03F 7/021; G03F 7/30
[52] U.S. Cl. .................. 430/192; 430/165; 430/191; 430/193; 534/557
[58] Field of Search .............. 430/165, 191, 192, 193, 430/190; 534/556, 557; 568/718, 719

[56] References Cited

U.S. PATENT DOCUMENTS

| | | | |
|---|---|---|---|
| 2,965,611 | 12/1960 | Schwarzer | 428/290 |
| 3,666,473 | 5/1972 | Colom et al. | 430/192 |
| 4,115,128 | 9/1978 | Kita | 430/192 |
| 4,173,470 | 11/1979 | Fahrenholtz | 430/165 |
| 4,340,767 | 7/1982 | Mina | 568/718 |
| 4,415,725 | 11/1983 | Hedges et al. | 568/718 |
| 4,426,513 | 1/1984 | Mark | 528/204 |
| 4,626,492 | 12/1986 | Eilbeck | 430/193 |
| 5,087,548 | 2/1992 | Hosaka et al. | 430/192 |
| 5,112,719 | 5/1992 | Yamada et al. | 430/193 |
| 5,173,389 | 12/1992 | Uenishi et al. | 430/193 |
| 5,177,172 | 1/1993 | Toukhy | 430/192 |

FOREIGN PATENT DOCUMENTS

| | | | |
|---|---|---|---|
| 63-261256 | 10/1988 | Japan | 430/192 |
| 4-12356 | 1/1992 | Japan | 430/192 |
| 4343359 | 11/1992 | Japan | 430/192 |

OTHER PUBLICATIONS

Introduction to Microlithography, ACS, No. 219, L. P. Thompson, pp. 112-121.

*Primary Examiner*—Charles L. Bowers, Jr.
*Assistant Examiner*—John S. Chu

*Attorney, Agent, or Firm*—Sughrue, Mion, Zinn, Macpeak & Seas

[57] ABSTRACT

Disclosed is a novel positive type photoresist composition comprising a 1,2-naphthoquinonediazido-5-(and/or -4-)sulfonic ester of a member selected from the group consisting of the polyhydroxy compounds represented by the following formula (I), (II) or (III) and an alkali-soluble resin:

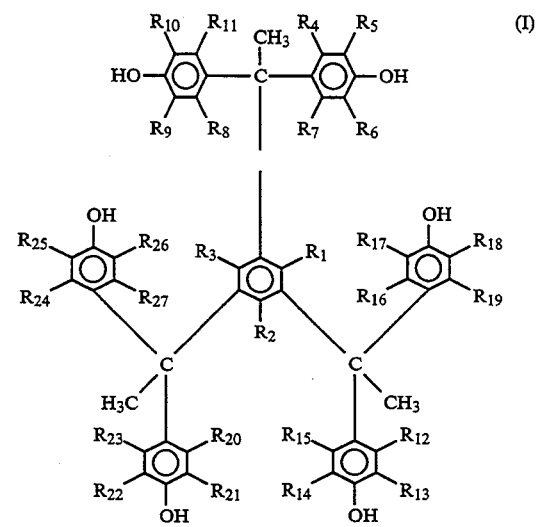

wherein the variables of Formula I are defined in the specification;

(Abstract continued on next page.)

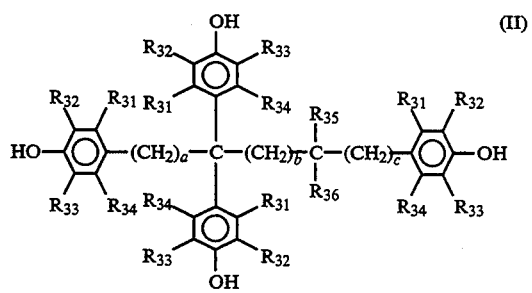 (II)
wherein the variables of Formula II are defined in the specification;
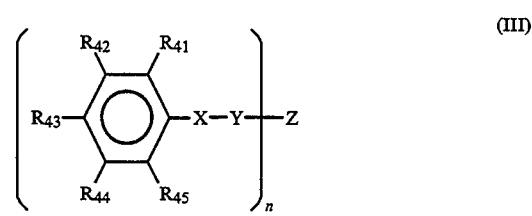 (III)
wherein the variables of Formula III are defined in the specification.
9 Claims, No Drawings

POSITIVE TYPE PHOTORESIST COMPOSITION

FIELD OF THE INVENTION

The present invention relates to a positive type photoresist composition which is sensitive to radiation. More particularly, the present invention relates to a photoresist composition for fine work which provides high resolution and sensitivity and has an excellently patterned cross section.

A positive type photoresist according to the present invention is coated on a substrate such as semiconducting wafer, glass, ceramics and metal by a spin coating method or a roller coating method to a thickness of 0.5 to 3 μm. The coat material is then heated and dried. A circuit pattern or the like is printed on the material through an exposure mask by irradiation with ultraviolet rays or the like. The material is then subjected to development to obtain a positive image.

Subsequently, the positive image is used as a mask to effect patterned etching on a substrate. Typical applications of positive type photoresist include production of semiconductors such as IC, production of circuit boards such as liquid crystal and thermal head, and photofabrication.

BACKGROUND OF THE INVENTION

Positive type photoresist compositions are normally compositions comprising an alkali-soluble resin and a naphthoquinone diazido compound as a light-sensitive material. Examples of such compositions include novolak type phenol resin/naphthoquinone diazido-substituted compounds as disclosed in U.S. Pat. Nos. 3,666,473, 4,115,128, and 4,173,470. Most typical examples of such compositions include a novolak resin made of cresol formaldehyde/trihydroxybenzophenone-1,2-naphthoquinonediazidosulfonic ester, as disclosed in L. F. Thompson, *Introduction to Microlithography*, ACS, No 219, pp 112–121.

Novolak resin, a binder, can be dissolved in an alkaline aqueous solution without swelling. The novolak resin can also exhibit a high resistance particularly to plasma etching when an image thus produced is used as a mask for etching. Thus, novolak resin is particularly useful in this application. As a light-sensitive material, a naphthoquinone diazido compound serves as a dissolution inhibitor for reducing the alkali solubility of novolak resin. But it is peculiar in that it under-goes decomposition upon irradiation with light to produce an alkali-soluble substance which rather enhances the alkali solubility of novolak resin. Because of the great change in properties resulting from irradiation with light, a naphthoquinone diazido compound is particularly useful as a light-sensitive material for positive type photoresist.

From this standpoint, many positive type photoresists comprising novolak resin and naphthoquinone diazido light-sensitive material have heretofore been developed and put to practical use. These positive type photoresists have attained sufficient results in working lines of a width of 1.5 to 2 μm.

However, integrated circuits have an increased degree of integration. There is a recent tendency to require working of ultrafine patterns formed of lines of a width of 1 μm or less in the production of semiconducting substrate such as SLSI. In such applications, a photoresist having a high resolution has been required to accomplish a high accuracy of reproduction of shape of exposure mask pattern and a high sensitivity for high productivity has been desired. The above mentioned prior art positive type photoresists cannot meet these requirements.

SUMMARY OF THE INVENTION

Therefore, the objects of the present invention are to provide, particularly in the production of semiconductor devices, (1) a positive type photoresist composition having a high resolution, (2) a positive type photoresist composition which provides an accurate reproduction of mask dimensions over a wide range of photomask line widths, (3) a positive type photoresist composition which can provide a resist pattern whose section has a high aspect ratio in a pattern having a line width of 1 μm or less, (4) a positive type photoresist composition which can provide a pattern having a shape whose section has a substantially vertical side wall, (5) a positive type photoresist composition having a wide development latitude, and (6) a positive type photoresist composition which can provide a resist image having excellent heat resistance.

Taking these requirements into account, the inventors made extensive studies. As a result, it was found that the above mentioned objects of the present invention can be accomplished by the use of an alkali-soluble resin and a quinone diazido compound having a specific structural formula.

The objects of the present invention are accomplished with a positive type photoresist composition comprising a 1,2-naphthoquinonediazido-5-(and/or -4-) sulfonic ester of a member selected from the group consisting of the polyhydroxy compounds represented by the following formula (I), (II) or (III) and an alkali-soluble resin:

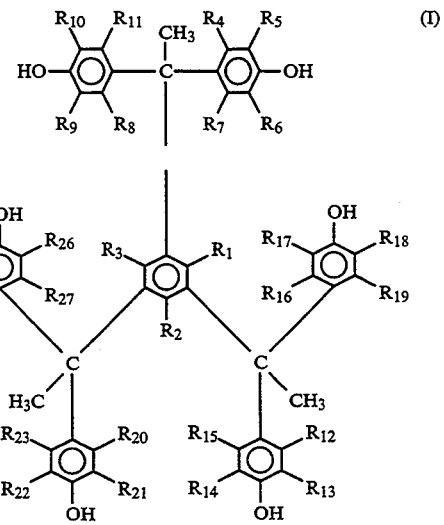

wherein $R_1$ to $R_{27}$, which may be the same or different, each represents a hydrogen atom, a hydroxyl group, a halogen atom, an alkyl group, an alkoxy group, a nitro group, an alkenyl group, an aralkyl group, an alkoxycarbonyl group, an arylcarbonyl group, an acyloxy group, an acyl group, an aryloxyl group or an aralkoxy group;

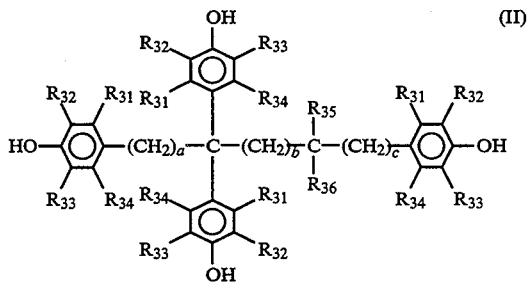

wherein $R_{31}$ to $R_{34}$, which may be the same or different and in which not all four groups for each of $R_{31}$ to $R_{34}$ may be the same at the same time, each represents a hydrogen atom, a hydroxyl group, a halogen atom, an alkyl group, an alkoxy group or an alkenyl group; $R_{35}$ and $R_{36}$ each represents a hydrogen atom, an alkyl group or

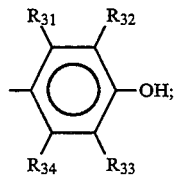

a and c each represents 0 or 1; and b represents 0 or an integer 1 to 4;

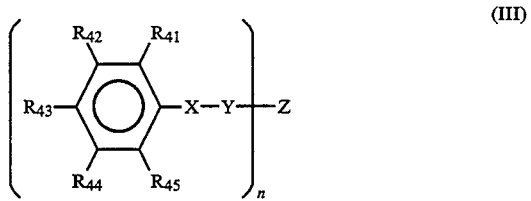

wherein $R_{41}$ to $R_{45}$, which may be the same or different, each represents a hydrogen atom, a hydroxyl group, a halogen atom, an alkyl group or an alkoxy group, with the proviso that at least one of $R_{41}$ to $R_{45}$ is a hydroxyl group; X represents a single bond or a —(CH$_2$)$_m$— group; Y represents a —COO—X— or —OCO—X— group; Z represents an organic group having a valence of n; n represents an integer 3 to 6; and m represents an integer 1 to 4.

DETAILED DESCRIPTION OF THE INVENTION

In formula (I), the halogen atom represented by $R_1$ to $R_{27}$ is preferably a chlorine, bromine or iodine atom. The alkyl group represented by $R_1$ to $R_{27}$ is preferably a $C_{1-4}$ alkyl group such as a methyl, ethyl, propyl, n-butyl, isobutyl group, sec-butyl and t-butyl group. The alkoxy group represented by $R_1$ to $R_{27}$ is preferably a $C_{1-4}$ alkoxy group such as a methoxy, ethoxy, hydroxyethoxy, propoxy, hydroxypropoxy, isopropoxy, n-butoxy, isobutoxy, sec-butoxy and t-butoxy group. The alkenyl group represented by $R_1$ to $R_{27}$ is preferably a $C_{2-4}$ alkenyl group such as a vinyl, propenyl, allyl and butenyl group.

The aryl group represented by $R_1$ to $R_{27}$ is preferably a phenyl, xylyl, toluyl or cumenyl group. The aralkyl group represented by $R_1$ to $R_{27}$ is preferably a benzyl, phenethyl or cumyl group. The alkoxycarbonyl group represented by $R_1$ to $R_{27}$ is preferably a methoxy-carbonyl or ethoxycarbonyl group. The arylcarbonyl group represented by $R_1$ to $R_{27}$ is preferably a benzoyloxy group. The acyloxy group represented by $R_1$ to $R_{27}$ is preferably a butyryloxy- or acetoxy group. The acyl group represented by $R_1$ to $R_{27}$ is preferably a formyl, acetyl, butyryl, benzoyl, cyanamoyl or valeryl group. The aryloxy group represented by $R_1$ to $R_{27}$ is preferably a benzyloxy group. The aralkoxy group represented by $R_1$ to $R_{27}$ is preferably a phenoxy group.

In formula (II), the halogen atom represented by $R_{31}$ to $R_{34}$ is preferably a chlorine, bromine or iodine atom. The alkyl group represented by $R_{31}$ to $R_{34}$ is preferably a $C_{1-4}$ alkyl group such as a methyl, ethyl, propyl, n-butyl, isobutyl group, sec-butyl and t-butyl group. The alkoxy group represented by $R_{31}$ to $R_{34}$ is preferably a $C_{1-4}$ alkoxy group such as a methoxy, ethoxy, hydroxyethoxy, propoxy, hydroxypropoxy, isopropoxy, n-butoxy, isobutoxy, sec-butoxy and t-butoxy group. The alkenyl group represented by $R_{31}$ to $R_{34}$ is preferably a $C_{2-4}$ alkenyl group such as a vinyl, propenyl, allyl and butenyl group.

In formula (III), the halogen atom represented by $R_{41}$ to $R_{45}$ is preferably a chlorine, bromine or iodine atom. The alkyl group represented by $R_{41}$ to $R_{45}$ is preferably a $C_{1-4}$ alkyl group such as a methyl, ethyl, propyl, n-butyl, isobutyl group, sec-butyl and t-butyl group. The alkoxy group represented by $R_{41}$ to $R_{45}$ is preferably a $C_{1-4}$ alkoxy group such as a methoxy, ethoxy, hydroxyethoxy, propoxy, hydroxypropoxy, isopropoxy, n-butoxy, isobutoxy, sec-butoxy and t-butoxy group.

The compound represented by formula (I) can be obtained by, e.g., the method described in JP-A-55-162728, that is, by allowing a carbonyl precursor and a phenol derivative to undergo reaction under acidic or alkaline conditions.

If the above reaction is effected under acidic conditions, a catalyst containing mercapto group is preferably used. Examples of such a catalyst include ethanethiol, 1-butanethiol, thiophenol, and mercaptoacetic acid. In the above condensation reaction, the phenol reactive compoent is preferably used in an amount exceeding the stoichiometrical value. The reaction temperature is preferably in the range of room temperature to 100° C., more preferably 100° C. or higher.

The progress of the condensation reaction can be monitored by chromatography or spectroscopy. For example, infrared spectroscopy can be employed to trace the progress of the condensation reaction easily by the reduction of the carbonyl absorption band.

The purification of these compounds can be carried out by recrystallization, elution chromatography or the like.

Examples of the solvents suitable for recrystallization include methylene chloride, benzene, cyclo-hexane, methanol, ethanol, and a mixture of alcohol and water.

The elution chromatography is preferably effected through alumina or silica with various solvents as eluents.

Specific examples of the compound thus obtained represented by formula (I) include α,α,α',α',α'',α''-hexakis-(4-hydroxyphenyl)-1,3,5-triethylbenzene, α,α,α', α',α'',α''-hexakis-(4-hydroxy-2,6-dimethylphenyl)-1,3,5-triethylbenzene, α,α,α',α',α'',α''-hexakis-(4-hydroxy-3,5-dimethylphenyl)-1,3,5-triethylbenzene, and α,α,α',α', α'',α''-hexakis-(4-hydroxy-3-methylphenyl)-1,3,5-triethylbenzene. However, the present invention should not be construed as being limited thereto.

These compounds may be used singly or in combination.

The compound represented by formula (II) can be obtained by, e.g., the method described in JP-A-55-162728, that is, by allowing a carbonyl precursor and a phenol derivative to undergo reaction under acidic or alkaline conditions using a p-hydroxyphenylketone compound obtained by the method described in, e.g., *Chemishe Berichte*, vol. 74, page 1772 (1941).

The compound represented by the general formula (II) can also be obtained by, e.g., the method described in U.S. Pat. No. 2,965,611, that is, by allowing a haloketone compound and a phenol derivative to undergo reaction under acidic conditions.

If the above reaction is effected under acidic conditions, a catalyst containing mercapto group is preferably used. Examples of such a catalyst include ethanethiol, 1-butanethiol, thiophenol, and mercaptoacetic acid. In the above condensation reaction, the phenol reactive component is preferably used in an amount exceeding the stoichiometrical value. The reaction temperature is preferably in the range of room temperature to 100° C., more preferably 100° C. or higher.

The progress of the condensation reaction can be monitored by chromatography or spectroscopy. For example, infrared spectroscopy can be employed to trace the progress of the condensation reaction easily by the reduction of the carbonyl absorption band.

The purification of these compounds can be carried out by recrystallization, elution chromatography or the like.

Examples of the solvents suitable for recrystallization include methylene chloride, benzene, cyclohexane, methanol, ethanol, and a mixture of alcohol and water.

The elution chromatography is preferably effected through alumina or silica with various solvents as eluents.

Specific examples of the compound thus obtained represented by formula (II) include the following compounds (II-a) to (II-p), but the present invention should not be construed as being limited thereto.

These polyhydroxy compounds may be used singly or in combination.

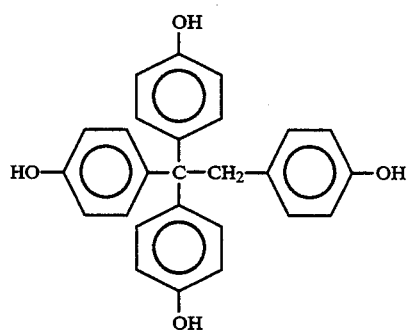
(II-a)

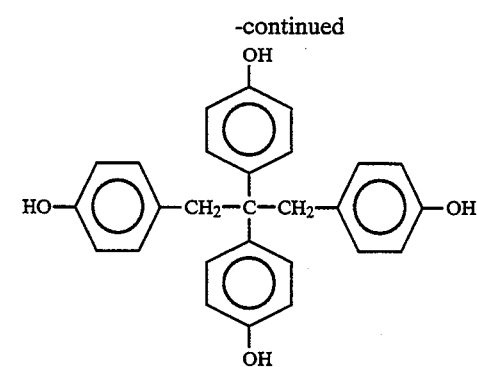
(II-b)

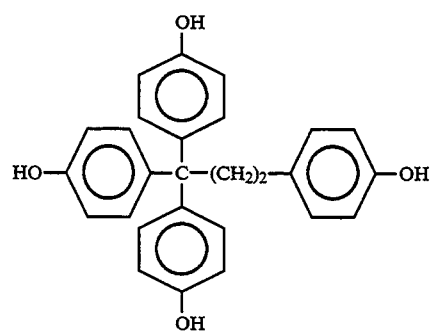
(II-c)

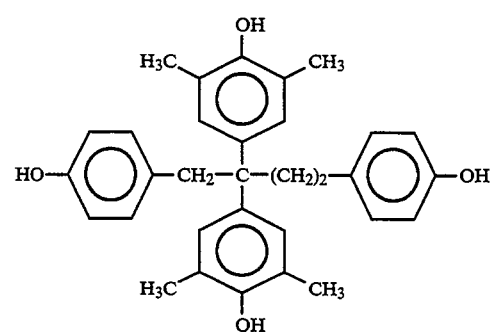
(II-d)

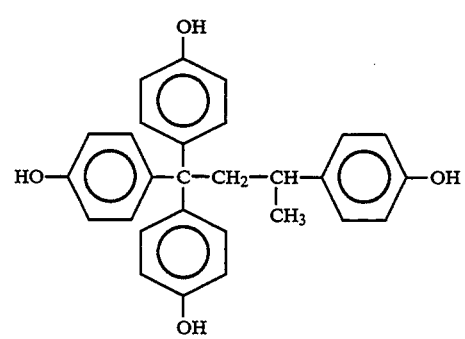
(II-e)

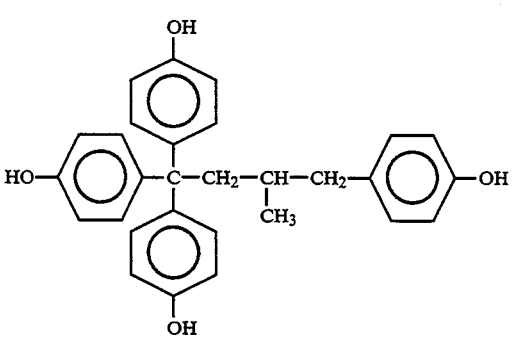
(II-f)

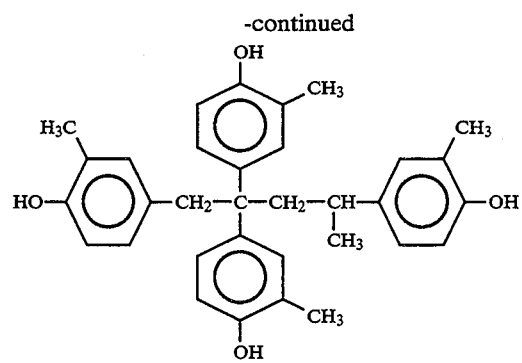 (II-g)
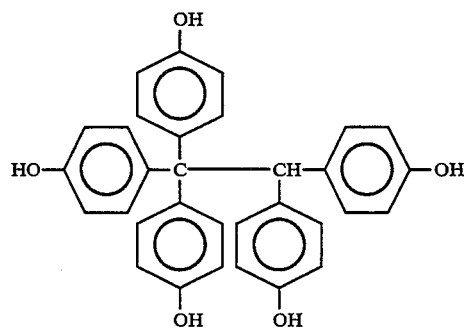 (II-h)
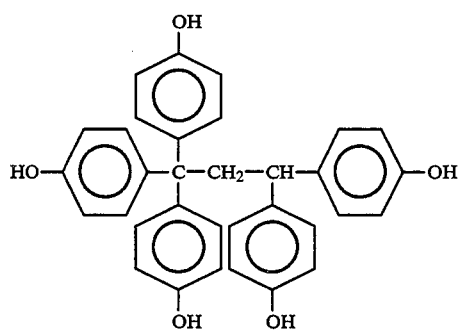 (II-i)
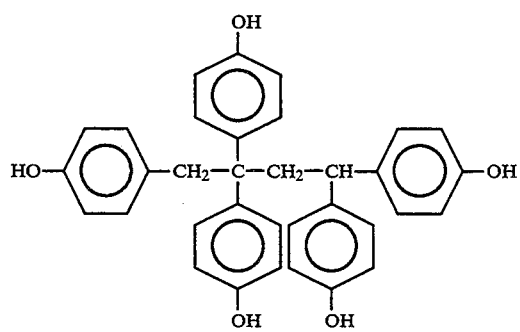 (II-j)
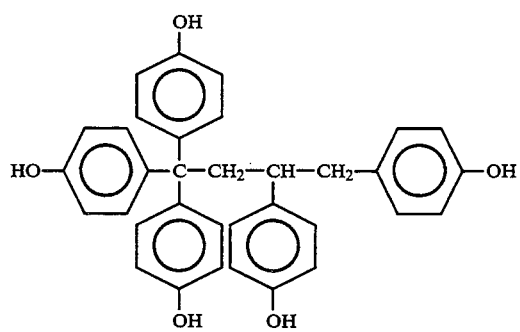 (II-k)
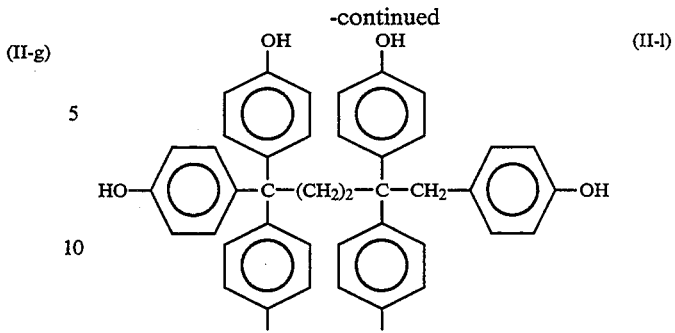 (II-l)
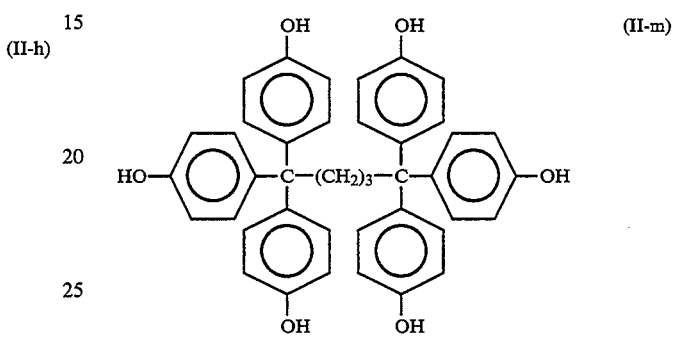 (II-m)
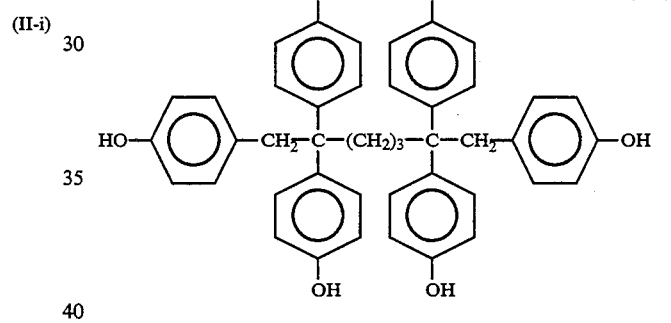 (II-n)
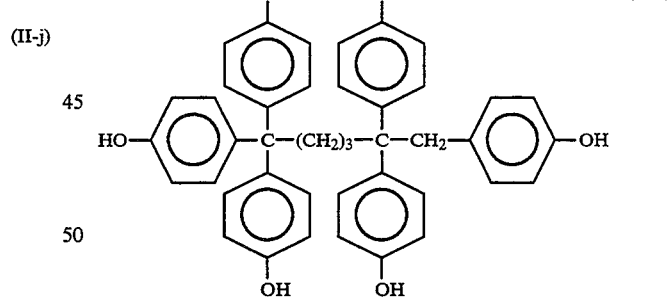 (II-o)
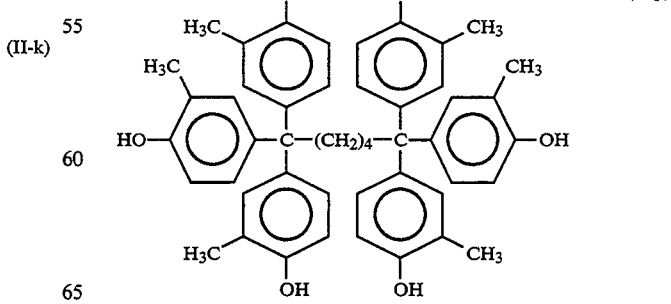 (II-p)
The compound represented by formula (III) can be synthesized by, e.g., the method described in JP-A-49-

57392, JP-A-51-21584, and JP-A-59-167537. For example, if Y in formula (III) is a —OCO—X— group, the compound represented by formula (III) can be obtained by allowing an alcohol compound represented by formula (IV) and a carboxylic acid compound represented by the following formula (V) to undergo reaction under ester producing conditions:

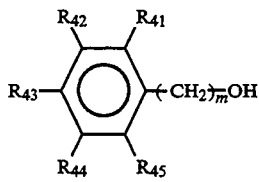

wherein $R_{41}$ to $R_{45}$ and m are as defined above.

wherein Z and n are as defined above for formula (III).

The reaction under ester producing conditions means the direct reaction of the two compounds preferably in the presence of an esterification catalyst, the reaction of the carboxylic acid compound in the form of active derivative thereof such as acid halide, acid anhydride and lower alkylester, or the reaction of the alcohol compound in the form of an active derivative thereof such as a lower carboxylic ester.

More particularly, if a carboxylic acid is used, the esterification reaction may be effected in an inert solvent in the presence of an acid catalyst. The acid catalyst can be sulfuric acid, paratoluenesulfonic acid, strongly acidic ion-exchanged resin or the like.

The reaction catalyst may be an aliphatic hydrocarbon such as n-pentane, n-hexane and n-heptane, an aliphatic hydrocarbon such as cyclohexane, an aromatic hydrocarbon such as benzene, toluene and xylene or the like. In order to enhance the rate of ester production, a method can be employed which comprises the removal of the resulting water from the reaction system by azeotropy with an inert solvent.

If a lower alkylester of a carboxylic acid is used, the ester interchange reaction is preferably effected by heating in an inert organic solvent in the presence of a strong base while removing the resulting lower alcohol from the reaction system. The reaction solvent can be an amide such as dimethylformamide, dimethylacetamide and hexamethylformamide, an organic solvent such as toluene and dimethylsulfoxide or the like. The strong base may be preferably a strongly basic alkaline metal compound such as sodium methylate, sodium ethylate, potassium hydroxide and sodium amide or a titanate compound such as tetraisopropyl titanate and tetrabutyl titanate. The reaction may preferably proceed at an elevated temperature of 30° C. to 180° C.

If an acid halide is used, the reaction may be effected in an inert solvent in the presence of a dehydrohalogenating agent at a temperature of 0° C. to 130° C., preferably 20° C. to 70° C. The dehydrohalogenating agent may be pyridine, triethylamine, dimethylaniline, tetramethylurea or the like. The inert solvent may be an aliphatic hydrocarbon such as n-hexane and n-heptane, an aromatic hydrocarbon such as benzene, toluene and xylene, an ether compound such as diethyl ether and tetrahydrofuran or the like.

If an acid anhydride is used, the reaction may be effected in an inert solvent or may be effected with a stoichiometrically excessive amount of an acid anhydride in the absence of an inert solvent. The inert solvent may be an aromatic hydrocarbon such as benzene, toluene and xylene, an ether compound such as diethyl ether and tetrahydrofuran or the like.

Specific examples of the compound represented by formula (III) prepared from the compounds represented by formula (IV) or (V) include the following compounds (III-a) to (III-d):

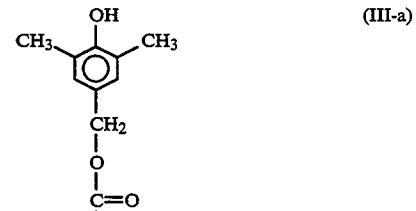

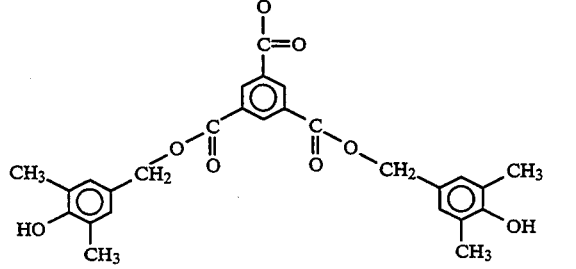

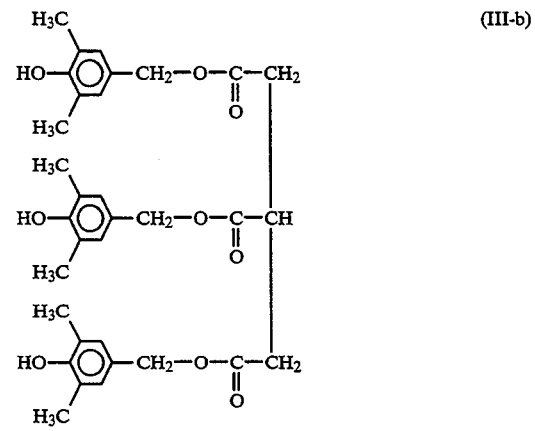

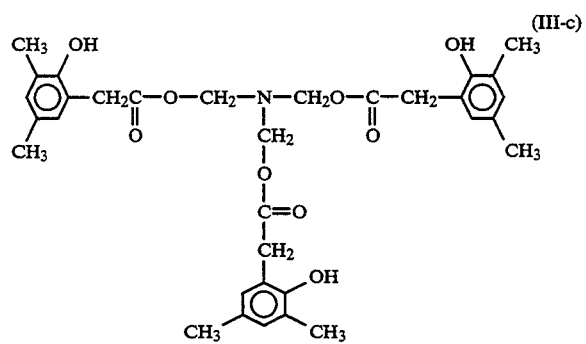

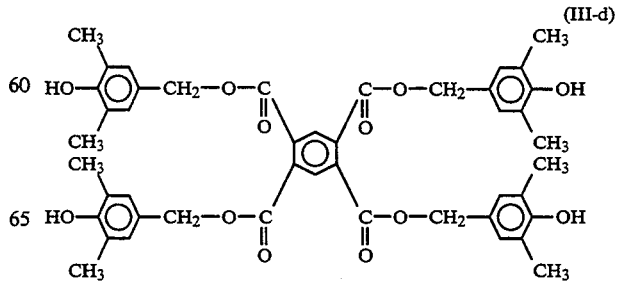

If Y in formula (III) is a —COO—X— group, the compound represented by formula (III) can be obtained by allowing an alcohol compound represented by formula (VI) and a carboxylic acid compound represented by the following formula (VII) to undergo reaction under ester producing conditions:

(HO—CH$_2$)$_n$—Z     (VI)

wherein Z and n are as defined above for formula (III).

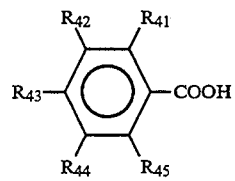     (VII)

wherein $R_{41}$ to $R_{45}$ are as defined above for formula (III).

Specific examples of the compound represented by formula (III) prepared from the compounds represented by formula (VI) or (VII) include the following compounds (III-e) to (III-j):

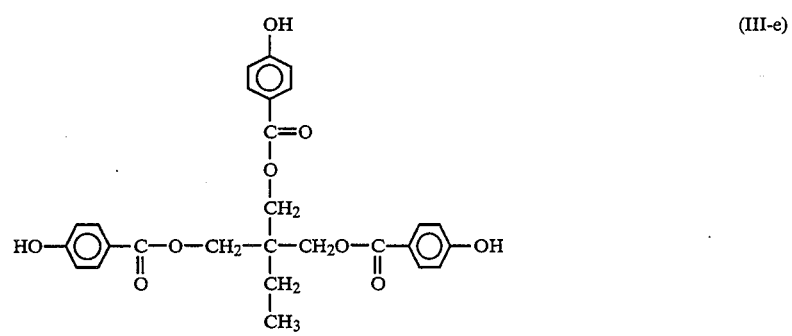     (III-e)

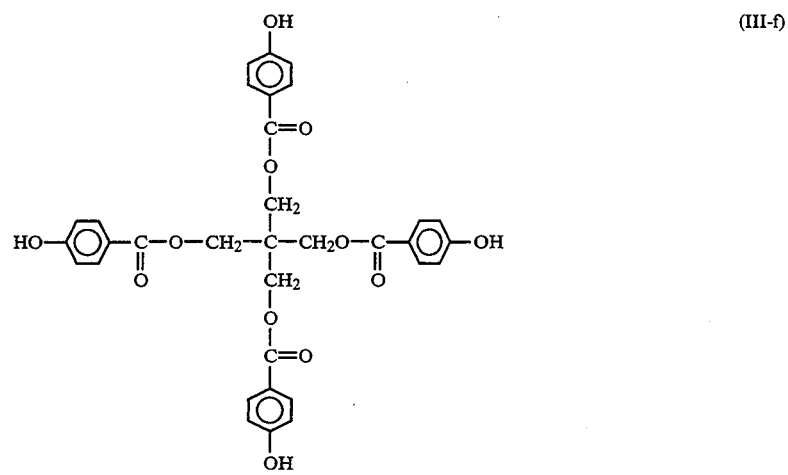     (III-f)

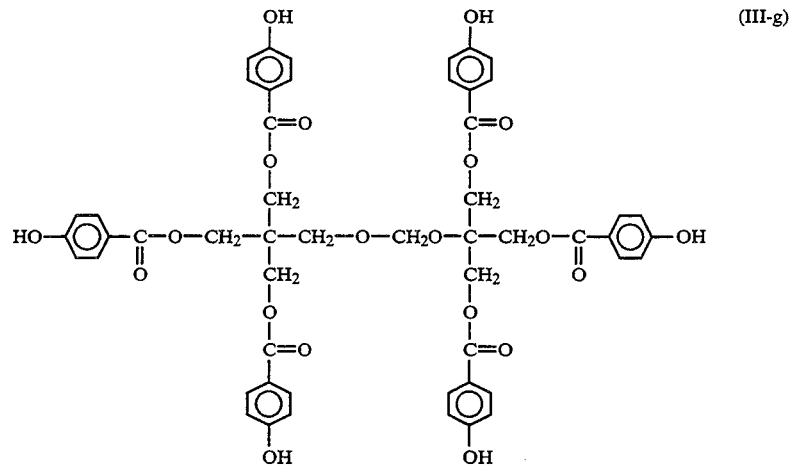     (III-g)

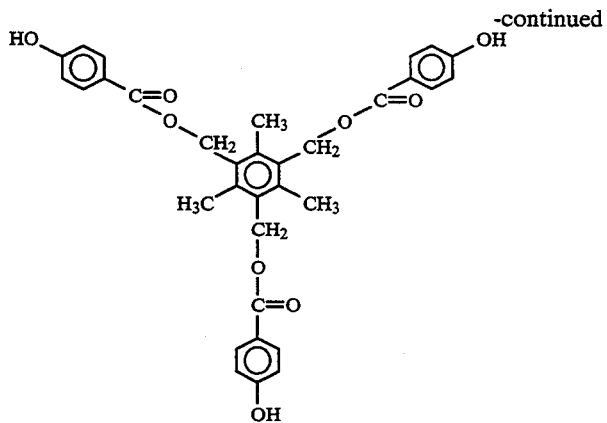
(III-h)

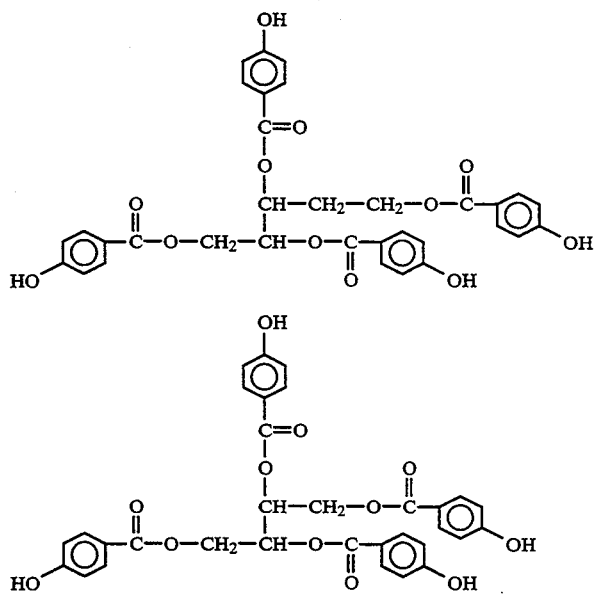
(III-i)

(III-j)

The compound of the present invention can be obtained, e.g., by allowing all or some of hydroxyl groups in the above mentioned compounds to undergo ordinary ester interchange reaction with 1,2-naphthoquinonediazido-5-(and/or -4-)sulfonyl chloride in the presence of a basic catalyst.

More particularly, a predetermined amount of a polyhydroxy compound, 1,2-naphthoquinonediazido-5-(and/or -4-)sulfonyl chloride and a solvent such as dioxane, acetone, methyl ethyl ketone and N-methylpyrrolidone are charged into a flask. To the reaction system is added dropwise a basic catalyst such as sodium hydroxide, sodium carbonate, sodium hydrogencarbonate and triethylamine to cause condensation. The resulting product is washed with water, purified, and then dried.

In the above mentioned esterification reaction, a mixture of compounds having different percent esterification and esterified position is obtained. Accordingly, the term "percent esterification" as used herein indicates the mean of the percent esterification of these components of the mixture.

The percent esterification thus defined can be controlled by the mixing ratio of the polyhydroxy compound as a starting material and the 1,2-naphthoquinonediazido-5-(and/or -4-)sulfonyl chloride. More particularly, since substantially all of 1,2-naphthoquinonediazido-5-(and/or -4-)sulfonyl chloride thus added can take part in the esterification reaction, the molar proportion of the starting material can be properly controlled to obtain a mixture having a desired percent esterification.

1,2-Naphthoquinonediazido-5-sulfonic ester and 1,2-naphthoquinonediazido-4-sulfonic ester can be used in combination as necessary.

The reaction temperature in the above mentioned synthesis method is normally in the range of −20° to 60° C., preferably 0° C. to 40° C.

The light-sensitive ester compounds thus synthesized can be blended in an alkali-soluble resin as a resin composition singly or in admixture. The amount of the compound to be blended is in the range of 5 to 100 parts by weight, preferably 10 to 50 parts by weight, based on 100 parts by weight of novolak resin. If this proportion falls below, the percent film remaining is remarkably reduced. On the contrary, if this proportion exceeds 100 parts by weight, the sensitivity and the solubility in the solvent are lowered.

Examples of the alkali-soluble resin to be used in the present invention include novolak resin, acetone-pyrogallol resin, polyhydroxy styrene, and the derivatives thereof.

Particularly preferred among these alkali-soluble resins is novolak resin. The novolak resin can be obtained by the addition condensation of an aldehyde with a predetermined monomer as a main component in the presence of an acidic catalyst.

Examples of such a predetermined monomer include cresols such as phenol, m-cresol, p-cresol and o-cresol, xylenols such as 2,5-xylenol, 3,5-xylenol, 3,4-xylenol and 2,3-xylenol, alkylphenols such as m-ethylphenol, p-ethylphenol, o-ethylphenol and p-t-butylphenol, alkoxy-phenols such as p-methoxyphenol, m-methoxyphenol, 3,5-dimethoxyphenol, 2-methoxy-4-methylphenol, m-ethoxy-phenol, p-ethoxyphenol, m-propoxyphenol, p-propoxy-phenol, m-butoxyphenol and p-butoxyphenol, bisalkylphenols such as 2-methyl-4-isopropylphenol, and hydroxyaromatic compounds such as m-chlorophenol, p-chlorophenol, o-chlorophenol, dihydroxybiphenyl, bisphenol A, phenylphenol, resorcinol and naphthol. These monomers may be used singly or in combination. The present invention is not limited to these monomers.

Examples of the aldehydes include formaldehyde, paraformaldehyde, acetaldehyde, propylaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaidehyde, o-methylbenzaldehyde, m-methylbenzaldehyde, p-methylbenzaldehyde, p-ethylbenzaldehyde, p-n-butylbenzaldehyde, furrural, chloroacetaldehyde, and acetal compounds thereof, e.g., chloroacetaldehyde diethyl acetal. Preferred among these aldehydes is formaldehyde.

These aldehydes may be used singly or in combination.

The acidic catalyst can be hydrochloric acid, sulfuric acid, formic acid, acetic acid, or oxalic acid.

The weight-average molecular weight of the novolak resin thus obtained is preferably in the range of 2,000 to 30,000. If this value falls below 2,000, the reduction in the film on the unexposed portion after development is increased. On the contrary, if this value exceeds 30,000, the development speed is reduced. The particularly preferred range of the weight-average molecular weight of the novolak resin is from 6,000 to 20,000.

The weight-average molecular weight of the novolak resin is defined by gel permeation chromatography as calculated in terms of polystyrene.

In the present invention, the above mentioned light-sensitive material should be the main component. If necessary, a product of esterification of polyhydroxy compound as mentioned below with 1,2-naphthoquinonediazido-5-(and/or -4-)sulfonyl chloride may be used in combination with the above mentioned light-sensitive material.

Examples of such a polyhydroxy compound include polyhydroxybenzophenones such as 2,3,4-trihydroxybenzophenone, 2,4,4'-trihydroxybenzophenone, 2,4,6-tri-hydroxybenzophenone, 2,3 ,4-trihydroxy-2'-methylbenzophenone, 2,3,4,4'-tetrahydroxybenzophenone, 2,2',4,4'-tetrahydroxybenzophenone, 2,4,6,3',4'-pentahydroxybenzophenone, 2,3,4,2',4'-pentahydroxybenzophenone, 2,3,4,2', 5'-pentahydroxybenzophenone, 2,4,6,3',4',5'-hexahydroxybenzophenone and 2,3,4,3',4',5'-hexahydroxybenzophenone, polyhydroxyphenylalkylketones such as 2,3,4-trihydroxyacetophenone, 2,3,4-trihydroxyphenylpentylketone and 2,3,4-trihydroxyphenylhexylketone, bis(poly)hydroxy-phenyl)alkanes such as bis(2,4-dihydroxyphenyl)methane, bis(2,3,4-trihydroxyphenyl)methane, bis(2,4-dihydroxyphenyl)propane-1, bis(2,3,4-trihydroxyphenyl)propane-1 and nordihydroguaiaretic acid, polyhydroxybenzoates such as propyl 3,4,5-trihydroxybenzoate, phenyl 2,3,4-trihydroxybenzoate and phenyl 3,4,5-trihydroxybenzoate, bis(polyhydroxybenzoyl)alkanes or bis(polyhydroxybenzoyl)aryls such as bis(2,3,4-trihydroxybenzoyl)methane, bis(3-acetyl-4,5,6-trihydroxyphenyl)methane, bis(2,3,4-trihydroxybenzoyl)benzene and bis((2,4,6-trihydroxybenzoyl)benzene, alkylene di(-polyhydroxybenzoate)'s such as ethylene glycol di(3,5-dihydroxybenzoate) and ethylene glycol di(3,4,5-trihydroxybenzoate), polyhydroxybiphenyls such as 2,3,4-biphenyltriol, 3,4,5-biphenyltriol, 3,5,3',5'-biphenyltetrol, 2,4,2',4'-biphenyltetrol, 2,4,6,3',5'-biphenylpentol, 2,4,6,2',4', 6'-biphenylhexol and 2,3,4,2',3',4'-biphenylhexol, bis(polyhydroxy)sulfides such as 4,4'-thiobis(1,3-dihydroxy)benzene, bis(polyhydroxyphenyl)sulfoxides such as 2,2',4,4'-tetrahydroxydiphenyl sulfoxide, bis(polyhydroxyphenyl)sulfones such as 2,2',4,4'-diphenylsulfone, polyhydroxytriphenylmethanes such as 4,4',3, 4''-tetrahydroxy-3,5,3',5'-tetramethyltriphenylmethane, 4,4',2'',3'',4''-pentahydroxy-3,5,3',5'-tetramethyltriphenylmethane, 2,3,4,2',3',4'-hexahydroxy-5,5'-diacetyltriphenylmethane, 2,3,4,2',3',4',3'',4''-octahydroxy-5,5'-diacetyltriphenylmethane and 2,4,6,2',4',6'-hexahydroxy-5,5'-dipropionyltriphenylmethane, polyhydroxyspirobiindanes such as 3,3,3',3'-tetramethyl-1,1'-spirobiindane-5,6,5',6'-tetrol, 3,3,3',3'-tetramethyl-1,1'-spirobiindane-5,6,7,5',6',7''-hexol, 3,3,3',3'-tetramethyl-1,1'-spirobiindane-4,5,6,4',5',6'-hexol and 3,3,3',3'-tetramethyl-1,1'-spirobiindane-4,5,6,5',6',7'-hexol, polyhydroxy phthalides such as 3,3-bis(3,4-dihydroxyphenyl)phthalide, 3,3-bis(2,3,4-trihydroxyphenyl)phthalide and 3',4',5',6-tetrahydroxyspiro[phthalide-3,9'-xanthene], polyhydroxybenzopyranes such as 2-(3,4-dihydroxyphenyl)-3,5,7-trihydroxybenzopyrane, 2-(3,4,5-trihydroxyphenyl)-3,5,7-trihydroxybenzopyrane, 2-(3,4-dihydroxyphenyl)-3-(3,4,5-trihydroxybenzoyloxy)-5,7-dihydroxybenzopyrane and 2-(3,4,5-trihydroxyphenyl)-3-(3,4,5-trihydroxybenzoyloxy)-5,7-dihydroxybenzopyrane, and flavono dyes such as morin, quercetin and rutin.

Further, oligomers of phenol resin such as novolak resin can be used.

One or combination of two or more products of the esterification of these polyhydroxy compounds with naphthoquinone diazido can be used.

The amount of the light-sensitive material to be used is in the range of 5 to 100 parts by weight, preferably 10 to 50 parts by weight, based on 100 parts by weight of alkali-soluble resin. If this value falls bellow 5 parts by weight, the percent film remaining is reduced. On the contrary, if this value exceeds 100 parts by weight, the sensitivity and the solubility of the light-sensitive material in the solvent ate reduced.

The composition of the present invention may further comprise other polyhydroxy compounds to accelerate its solubility in the developer. Preferred examples of such polyhydroxy compounds include phenols, resorcin, phloroglucin, 2,3,4-trihydroxybenzophenone, 2,3,4,4'-tetrahydroxybenzophenone, 2,3,4,3',4',5'-hexahydroxybenzophenone, acetone-pyrogallol condensation resin, phloroglucide, 2,4,2',4'-biphenyltetrol, 4,4'-thiobis(1,3-dihydroxy)benzene, 2,2',4,4'-tetrahydroxydiphenylether 2,2',4,4'-tetrahydroxyphenylsulfoxide, 2,2',4,4'-tetrahydroxydiphenylsulfone, bis (2,4-dihydroxyphenyl)methane, bis(2,3,4-trihydroxyphenyl)methane, bisphenol A, bisphenol AF, bisphenol S and bisphenol F.

These polyhydroxy compounds may be blended with the polyhydroxy compound of the present invention in an amount of 50 parts by weight or less, preferably 30 parts by weight or less, based on 100 parts by weight of the polyhydroxy compound of the present invention.

Examples of the solvent for dissolving the light-sensitive material and the alkali-soluble novolak resin of the present invention include ketones such as methyl ethyl ketone and cyclohexanone, ketoethers such as 4-ethoxy-2-butanone and 4-methoxy-4-methyl-2-pentanone, alcohol ethers such as ethylene glycol monomethyl ether and ethylene glycol monoethyl ether, ethers such as dioxane and ethylene glycol dimethyl ether, cellosolve esters such as methyl cellosolve acetate and ethyl cellosolve acetate, aliphatic esters such as butyl acetate, methyl lactate and ethyl lactate, halogenated hydrocarbons such as 1,1,2-trichloroethylene, and high polarity solvents-such as dimethyl acetamide, N-methyl pyrrolidone, dimethyl formamide and dimethyl sulfoxide. These solvents may be used singly or in admixture.

The positive type photoresist composition of the present invention may comprise a surface active agent to improve further coating properties such as striation.

Examples of such a surface active agent include nonionic surface active agents such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkyl allyl ethers (e.g., polyoxyethylene octyl phenol ether, polyoxyethylene nonyl phenol ether), polyoxyethylene-polyoxypropylene block copolymers, sorbitan aliphatic esters (e.g., sorbitan monolaurate, sorbitan monopalmitate, sorbitan monostearate, sorbitan monooleate, sorbitan trioleate, sorbitan tristearate) and polyoxyethylene sorbitan aliphatic esters (e.g., polyoxy-ethylene sorbitan monolaurate, polyoxyethylene sorbitan monopalmitate, polyoxyethylene sorbitan monostearate, polyoxyethylene sorbitan trioleate, polyoxyethylene sorbitan tristearate), fluorine surface active agents such as Eftop EF301, EF303 and EF352 (produced by Shin-Akita Kasei), Megafac F171, F173 (produced by Dainippon Ink And Chemicals, Incorporated), Florad FC430, FC431 (Produced by Sumitomo 3M), and Asahi Guard AG710, Surflon S-382, SC101, SC102, SC-103, SC-104, SC-105, SC-106 (Asahi Glass Company, Limited), Organosiloxane polymer KP341 (produced by The Shin-Etsu Chemical Industry Co., Ltd), and acrylic or methacrylic (co)polymer Polyflow Nos. 75 and 95 (produced by Kyoeisha Yushi Kagaku Kogyo K.K.). The amount of such a surface active agent to be blended in the system is normally in the range of 2 parts by weight or less, preferably 1 part by weight or less, based on 100 parts by weight of the alkali-soluble resin and quinone diazido compound in the composition of the present invention.

These surface active agents can be added to the system singly or in combination.

The developer for the positive type photoresist composition of the present invention can be an aqueous solution of an inorganic alkali such as sodium hydroxide, potassium hydroxide, sodium carbonate, sodium silicate, sodium metasilicate and aqueous ammonia, a primary amine such as ethylamine and n-propylamine, a secondary amine such as diethylamine and di-n-butylamine, a tertiary amine such as triethylamine and methyldiethylamine, an alcohol amine such as dimethylethanolamine and triethanolamine, a quaternary ammonium salt such as tetramethylammonium hydroxide and tetraethylammonium hydroxide, a cyclic amine such as pyrrole and piperidine. To such an aqueous solution of an alkali may be added an alcohol, surface active agent or the like in a proper amount.

The positive type photoresist composition of the present invention can optically comprise a dye, plasticizer, adhesion aid, etc.

Specific examples of such a dye include Methyl Violet, Crystal Violet, and Malachite Green. Specific examples of such a plasticizer include stearic acid, acetal resin, phenoxy resin, and alkyd resin. Specific examples of such an adhesion aid include hexamethyl disilazane and chloromethyl silane.

The above mentioned positive type photoresist composition can be coated on a substrate for use in the preparation of precision integrated circuit elements (e.g., silicon/silicon dioxide coat) by a proper maens such as spinner and coater, exposed to light through a predetermined mask, and then developed to obtain an excellent resist.

The present invention will be further described in the following examples, but the present invention should not be construed as being limited thereto. The unit % as used herein indicates % by weight.

EXAMPLES 1 AND 2; COMPARATIVE EXAMPLES 1 AND 2

(1) SYNTHESIS EXAMPLE 1: Synthesis of $\alpha,\alpha,\alpha',\alpha',\alpha'',\alpha''$-hexakis-(4-hydroxyphenyl)-1,3,5-triethylbenzene as Compound (I-a)

To a melt mixture of 282 g of phenol and 30.6 g of 1,3,5-triacetylbenzene was added 3.0 ml of thioglycolic acid. Hydrogen chloride gas was then introduced into the reaction system at a temperature of 50° C. After infrared absorption spectrum and gas chromatography indicated the elimination of all the starting material and hence the completion of formation of hexaphenol, phenol was then distilled off from all the reaction products under reduced pressure. The reaction products were then recrystallized from aqueous methanol for purification. The resulting white crystal exhibited a purity of 97% by gas chromatography and a melting point of 172° to 178° C.

(2) SYNTHESIS EXAMPLE 2: Synthesis of $\alpha,\alpha,\alpha',\alpha',\alpha'',\alpha''$-hexakis-(4-hydroxy-2,6-dimethylphenyl)-1,3,5-triethylbenzene as Compound (I-b)

Compound (I-b) was synthesized in the same manner as Synthesis Example 1, except that 366 g of 2,6-xylenol was used instead of phenol. The resulting white crystal exhibited a purity of 99% by gas chromatography and a melting point of 174° to 180° C.

(3) Synthesis of light-sensitive material a 35.7 g of $\alpha,\alpha,\alpha',\alpha',\alpha'',\alpha''$-hexakis-(4-hydroxyphenyl)-1,3,5-triethylbenzene synthesized in Synthesis Example 1, 60.4 g of 1,2-naphthoquinonediazido-5-sulfonyl chloride and 600 ml of acetone were charged into a three-necked flask to make a uniform solution. To the reaction system was then gradually added dropwise a mixture of 23.9 g of triethylamine and 100 ml of acetone. The reaction system was then allowed to undergo reaction at a temperature of 25° C. for 3 hours. The reaction mixture was then poured into 3,000 ml of a 1% aqueous solution of hydrochloric acid. The resulting precipitate was filtered off, washed with water, and then dried at a temperature of 40° C. to obtain 63.7 g of 1,2-naphthoquinonediazido-5-sulfonic ester of $\alpha,\alpha,\alpha',\alpha',\alpha'',\alpha''$-hexakis-(4-hydroxyphenyl)-1,3,5-triethylbenzene (light-sensitive material a).

(4) Synthesis of light-sensitive material b 46.5 g of $\alpha,\alpha,\alpha',\alpha',\alpha'',\alpha''$-hexakis-(4-hydroxy-2,6-dimethylphenyl)-1,3,5-triethylbenzene synthesized in Synthesis Example 2, 53.7 g of 1,2-naphthoquinonediazido-5-sulfonyl chloride and 600 ml of acetone were charged into a three-necked flask to make a uniform solution. To the reaction system was then gradually added dropwise a mixture of 21.2 g of triethylamine and 100 ml of acetone. The reaction system was then allowed to undergo reaction at a temperature of 25° C. for 5 hours. The reaction mixture was then poured into 3,000 ml of a 1% aqueous solution of hydrochloric acid. The resulting precipitate was filtered off, washed with water, and then dried at a temperature of 40° C. to obtain 70.1 g of 1,2-naphthoquinonediazido-5-sulfonic ester of $\alpha,\alpha,\alpha',\alpha',\alpha'',\alpha''$-hexakis-(4-hydroxy-2,6-dimethylphenyl)-1,3,5-triethylbenzene (light-sensitive material b).

(5) Synthesis of light-sensitive material c 11.5 g of 2,3,4-trihydroxybenzophenone, 30.2 of 1,2-naphthoguinonediazido-5-sulfonyl chloride and 300 ml of acetone were charged into a three-necked flask- to make a uniform solution. To the reaction system was then gradually added dropwise a mixture of 11.4 g of triethylamine and 50 ml of acetone. The reaction system was then allowed to undergo reaction at a temperature of 25° C. for 3 hours. The reaction mixture was then poured into 1,500 ml of a 1% aqueous solution of hydrochloric acid. The resulting precipitate was filtered off, washed with water, and then dried at a temperature of 40° C. to obtain 29.8 g of 1,2-naphthoquinonediazido-5-sulfonic ester of 2,3,4-trihydroxybenzophenone (light-sensitive material c).

(6) Synthesis of light-sensitive material d 12.3 g of 2,3,4,4'-tetrahydroxybenzophenone, 40.3 of 1,2-naphthoquinonediazido-5-sulfonyl chloride and 300 ml of acetone were charged into a three-necked flask to make a uniform solution. To the reaction system was then gradually added dropwise a mixture of 15.2 g of triethylamine and 50 ml of acetone. The reaction system was then allowed to undergo reaction at a temperature of 25° C. for 3 hours. The reaction mixture was then poured into 1,500 ml of a 1% aqueous solution of hydrochloric acid. The resulting precipitate was filtered off, washed with water, and then dried at a temperature of 40° C. to obtain 39.7 g of 1,2-naphthoquinonediazido-5-sulfonic ester of 2,3,4,4'-tetrahydroxybenzophenone (light-sensitive material d).

(7) Synthesis of novolak resin 40 g of m-cresol, 60 g of p-cresol, 49.0 g of a 37% aqueous solution of formaldehyde and 0.13 g of oxalic acid were charged into a three-necked flask. The material was then heated to a temperature of 100° C. with stirring at which temperature it was allowed to undergo reaction for 15 hours.

The reaction system was then heated to a temperature of 200° C., and its pressure was gradually reduced to 5 mmHg at which point water, unreacted monomers, formaldehyde and oxalic acid were then removed. The molten alkali-soluble novolak resin was cooled to room temperature at which point it was then recovered. The novolak resin thus obtained exhibited an average molecular weight of 7,100 as calculated in terms of polystyrene.

(8) Preparation and evaluation of positive type photoresist composition 1.3 of each of the light-sensitive material a to d obtained in Synthesis Examples (3) to (6), respectively, and 5 g of the cresol novolak resin (molecular weight: 7,100) obtained in step (7) were dissolved in 15 g of ethyl cellosolve acetate. The material was filtered through a microfilter having a pore diameter of 0.2 $\mu$m to prepare a photoresist composition. The photo-resist composition was coated on a silicon wafer by a spinner, and then dried by a vacuum hot plate at a temperature of 100° C. for 90 seconds to obtain a resist film having a thickness of 1.2 $\mu$m.

The resist film was exposed to light by means of a reduction projection exposing apparatus FPA-1550 available from Canon Inc., developed with a 2.38% aqueous solution of tetramethyl ammonium hydroxide for 1 minute, washed with water for 30 seconds, and then dried.

The resist pattern thus formed on the silicon wafer was observed under a scanning type electron microscope for evaluation. The results are set forth in Table 1.

Relative sensitivity is defined as the reciprocal of the exposure reproducing a 0.70 $\mu$m mask pattern, represented relative to the value of Comparative Example 1.

The percent film remaining represents by the percentage of retained film from before to after development.

Resolving power indicates the threshold resolving power at the exposure reproducing a 0 70 $\mu$m mask pattern.

Heat resistance indicates the temperature at which the silicon wafer on which a resist pattern has been formed shows no pattern deformation after being baked in a convection oven for 30 minutes.

The resist shape is represented by the angle ($\theta$) of the surface of the resist wall with the plane of the silicon wafer in a section of a 0.70 $\mu$m resist pattern.

The results show that the resists comprising the light-sensitive materials a and b of the present invention were excellent particularly in resolving power and resist shape.

The light-sensitive materials of the present invention were excellent in the solubility in ethylene glycol monomethyl ether acetate. The resist composition solutions comprising these light-sensitive materials showed no precipitation even after storage at a temperature of 40° C. for 50 days, while the resist composition solutions comprising the comparative light-sensitive materials c and d showed some precipitation under the same conditions.

TABLE 1

| Example No. | Light-sensitive material | Results of Evaluation | | | | |
| --- | --- | --- | --- | --- | --- | --- |
| | | Relative sensitivity | % Film remaining | Resolving power ($\mu$m) | Heat resistance (°C.) | Resist shape ($\theta$) |
| Example | | | | | | |
| 1 | a | 1.4 | 100 | 0.50 | 160 | 89 |

TABLE 1-continued

| Example No. | Light-sensitive material | Relative sensitivity | % Film remaining | Resolving power (μm) | Heat resistance (°C.) | Resist shape (θ) |
| --- | --- | --- | --- | --- | --- | --- |
| 2 | b | 1.3 | 100 | 0.50 | 160 | 88 |
| Comparative Example | | | | | | |
| 1 | c | 1.0 | 98 | 0.60 | 140 | 84 |
| 2 | d | 1.1 | 98 | 0.55 | 140 | 83 |

EXAMPLES 3 TO 5; COMPARATIVE EXAMPLES 3 and 4

(1) Synthesis Example 1: Synthesis of Compound (II-b)

To 25.4 g (0.20 mol) of dichloroacetone was added 188 g (2.0 mol) of phenol. The admixture was heated to a temperature of 45° C. Hydrogen chloride gas was introduced into the reaction solution. When the reaction solution turned yellow, heating was suspended, and the introduction of hydrogen chloride gas continued for 2 hours. The resulting reddish brown reaction mixture was distilled under reduced pressure to remove excess phenol. The resulting reddish brown solid residue was washed with n-hexane, and then purified through column chromatography (filler: silica gel; eluate: n-hexane/ethyl acetate=2/1). As a result, 72 g of a white powder was obtained. The powder was confirmed by NMR (nuclear magnetic resonance) to be 1,2,2,3-tetrakis(4'-hydroxyphenyl)propane (II-b).

(2) Synthesis Example 2: Synthesis of Compound (II-c)

A mixture of 66.5 g (0.40 mol) of 4-hydroxyphenyl-propionic acid and 16.4 g (0.12 mol) of lead chloride was heated to a temperature of 140° C. to make solution. To the solution was added 75.3 g (0.80 mol) of phenol. The admixture was stirred at a temperature of 140° C. for 6 hours. The resulting reddish brown reaction mixture was put into 1.5 l of ice-water. The material was then extracted with ethyl acetate. The extract was dried and then concentrated. The resulting dark brown viscous oil was then purified through column chromatography (filler: silica gel; eluate: n-hexane/ ethyl acetate=4/1). As a result, 55 g of a white powder (1,3-bis(4'-hydroxyphenyl)-1-propane) having the following chemical structure was obtained:

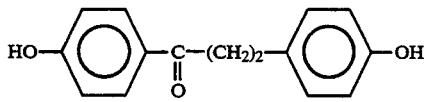

To 48.5 g of 1,3-bis(4'-hydroxyphenyl)-1-propanone were added 188 g (2.0 mol) of phenol and 1 ml of thioglycolic acid. The admixture was heated to a temperature of 50° C. Hydrogen chloride gas was introduced into the reaction system for 7 hours. The reaction system was stirred at a temperature of 50° C. for 10 hours. The resulting dark brown reaction mixture was distilled under reduced pressure to remove excess phenol. The resulting dark brown solid was purified through column chromatography (filler: silica gel; eluate: n-hexane/ethyl acetate=3/1). As a result, 43 g of a white powder was obtained. The white powder was then confirmed by NMR to be 1,1,1,3-tetrakis(4'-hydroxyphenyl)propane (II-c).

(3) Synthesis Example 3: Synthesis of Compound (II-m)

A mixture of 52.8 g (0.40 mol) of glutaric acid and 32.7 g (0.24 mol) of lead chloride was heated to a temperature of 140° C. to make a solution. To the solution was added 151 g (1.6 mol) of phenol. The admixture was stirred at a temperature of 140° C. for 6 hours. The resulting reddish brown reaction mixture was put into 1.5 l of ice-water. The material was then extracted with ethyl acetate. The extract was dried and then concentrated. The resulting dark brown viscous oil was then purified through column chromatography (filler: silica gel; eluate: n-hexane/ethyl acetate=3/1). As a result, 59 g of a white powder (1,5-bis(4'-hydroxyphenyl)-1,5-pentadione) having the following chemical structure was obtained:

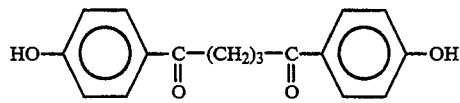

To 56.9 g of 1,5-bis(4'-hydroxyphenyl)-1,5-pentanedione were added 376 g (4.0 mol) of phenol and 2 ml of thioglycolic acid. The admixture was heated to a temperature of 50° C. Hydrogen chloride gas was introduced into the reaction system for 8 hours. The reaction system was stirred at a temperature of 50° C. for 12 hours. The resulting dark brown reaction mixture was distilled under reduced pressure to remove excess phenol. The resulting dark brown solid was purified through column chromatography (filler: silica gel; eluate: n-hexane/ethyl acetate=2/1). As a result, 56 g of a white powder was obtained. The white powder was then confirmed by NMR to be 1,1,1,5,5,5-hexakis(4'-hydroxyphenyl)pentane (II-m).

(4) Synthesis of light-sensitive material e 41.2 g of 1,2,2,3-tetrakis(4'-hydroxyphenyl)propane synthesized in Synthesis Example (1), 80.6 g of 1,2-naphthoquinonediazido-5-sulfonyl chloride, and 600 ml of acetone were charged into a three-necked flask to make a uniform solution. To the reaction system was then gradually added dropwise a mixture of 31.9 g of triethylamine and 100 ml of acetone. The reaction system was then allowed to undergo reaction at a temperature of 25° C. for 3 hours. The reaction mixture was then poured into 3,000 ml of a 1% aqueous solution of hydrochloric acid. The resulting precipitate was filtered off, washed with water, and then dried at a temperature of 40° C. to obtain 78.0 g of 1,2-naphthoquinonediazido-5-sulfonic ester of 1,2,2,3-tetrakis(4'-hydroxyphenyl)propane (light-sensitive material e).

(5) Synthesis of light-sensitive material f 41.2 g of 1,1,1,3-tetrakis(4'-hydroxyphenyl)propane synthesized in Synthesis Example (2), 75.2 g of 1,2- naphthoquinonediazido-5-sulfonyl chloride, and 600 ml of acetone were charged into a three-necked flask to make a uniform solution. To the reaction system was then gradually added dropwise a mixture of 29.8 g of triethylamine and 100 ml of acetone. The reaction system was then allowed to undergo reaction at a temperature of 25° C. for 5 hours. The reaction mixture was then poured into 3,000 ml of a 1% aqueous solution of hydrochloric acid. The resulting precipitate was filtered off, washed with water, and then dried at a temperature of 40° C. to obtain 73.2 g of 1,2-naphthoquinonediazido-5-sulfonic ester of 1,1,1,3-tetrakis(4'-hydroxyphenyl)propane (light-sensitive material f).

(6) Synthesis of light-sensitive material g 31.2 g of 1,1,1,5,5,5-hexakis(4'-hydroxyphenyl)pentane synthesized in Synthesis Example (3), 60.4 g of 1,2-naphthoquinonediazido-5-sulfonyl chloride, and 600 ml of acetone were charged into a three-necked flask to make a uniform solution. To the reaction system was then gradually added dropwise a mixture of 23.9 g of triethylamine and 100 ml of acetone. The reaction system was then allowed to undergo reaction at a temperature of 25° C. for 5 hours. The reaction mixture was then poured into 3,000 ml of a 1% aqueous solution of hydrochloric acid. The resulting precipitate was filtered off, washed with water, and then dried at a temperature of 40° C. to obtain 57.3 g of 1,2-naphthoquinonediazido-5-sulfonic ester of 1,1,1,5,5,5-hexakis-(4'-hydroxyphenyl)pentane (light-sensitive material g).

(7) Synthesis of light-sensitive material h 11.5 g of 2,3,4-trihydroxybenzophenone, 30.2 g of 1,2-naphthoquinonediazido-5-sulfonyl chloride, and 300 ml of acetone were charged into a three-necked flask to make a uniform solution. To the reaction system was then gradually added dropwise a mixture of 11.4 g of triethylamine and 50 ml of acetone. The reaction system was then allowed to undergo reaction at a temperature of 25° C. for 3 hours. The reaction mixture was then poured into 1,500 ml of a 1% aqueous solution of hydrochloric acid. The resulting precipitate was filtered off, washed with water, and then dried at a temperature of 40° C. to obtain 29.8 g of 1,2-naphthoquinonediazido-5-sulfonic ester of 2,3,4-trihydroxybenzophenone (light-sensitive material h).

(8) Synthesis of light-sensitive material i 12.3 g of 2,3,4,4'-tetrahydroxybenzophenone, 40.3 g of 1,2-naphthoquinonediazido-5-sulfonyl chloride, and 300 ml of acetone were charged into a three-necked flask to make a uniform solution. To the reaction system was then gradually added dropwise a mixture of 15.2 g of triethylamine and 50 ml of acetone. The reaction system was then allowed to undergo reaction at a temperature of 25° C. for 3 hours. The reaction mixture was then poured into 1,500 ml of a 1% aqueous solution of hydrochloric acid. The resulting precipitate was filtered off, washed with water, and then dried at a temperature of 40° C. to obtain 39.7 g of 1,2-naphthoquinonediazido-5-sulfonic ester of 2,3,4,4'-tetrahydroxybenzophenone (light-sensitive material i).

(9) Preparation and evaluation of positive type photoresist composition 1.3 g of each of the light-sensitive material e to i obtained in Synthesis Examples (4) to (8), respectively, and 5 g of the cresol novolak resin (molecular weight: 7,100) obtained in the step (7) of Example 1 were dissolved in 15 g of ethyl cellosolve acetate. The material was filtered through a microfilter having a pore diameter of 0 2 μm to prepare a photoresist composition. The photoresist composition was coated on a silicon wafer by a spinner, and then dried by a vacuum hot plate at a temperature of 100° C. for 90 seconds to obtain a resist film having a thickness of 1 2 μm.

The resist film was exposed to light by means of a reduction projection exposing apparatus FPA-1550 available from Canon Inc., developed with a 2.38% aqueous solution of tetramethyl ammonium hydroxide for 1 minute, washed with water for 30 seconds, and then dried.

The resist pattern thus formed on the silicon wafer was observed under a scanning type electron microscope for evaluation. The results are set forth in Table 2.

Relative sensitivity is defined as the reciprocal of the exposure reproducing a 0.70 μm mask pattern, represented relative to the value of Comparative Example 3.

The percent film remaining, the resolving power, the heat resistance and the resist shape were evaluated in the same manner as in the foregoing examples.

The results show that the resists comprising the light-sensitive materials e and g of the present invention were excellent particularly in resolving power and resist shape.

The light-sensitive materials e to g of the present invention were excellent in solubility in ethylene glycol monomethyl ether acetate. The resist composition solutions comprising these light-sensitive materials showed no precipitation even after storage at a temperature of 40° C. for 50 days, while the resist composition solutions comprising the comparative light-sensitive materials h and i showed some precipitation under the same conditions.

TABLE 2

| Example No. | Light-sensitive material | Relative sensitivity | % Film remaining | Resolving power (μm) | Heat resistance (°C.) | Resist shape (θ) |
|---|---|---|---|---|---|---|
| Example | | | | | | |
| 3 | e | 1.3 | 100 | 0.50 | 160 | 89 |
| 4 | f | 1.4 | 100 | 0.50 | 160 | 88 |
| 5 | g | 1.5 | 100 | 0.50 | 160 | 89 |
| Comparative Example | | | | | | |
| 3 | h | 1.0 | 98 | 0.60 | 140 | 84 |
| 4 | i | 1.1 | 98 | 0.55 | 140 | 83 |

EXAMPLES 6 TO 9.[. COMPARATIVE EXAMPLES 5, 6

(1) Synthesis of Compound (III-a)

Into a 1,000 ml-reaction vessel equipped with a condenser, a thermometer and a nitrogen-introducing pipe were charged 15.4 g of methyl 1,3,5-benzenetricarboxylate, 27.4 g of (2,6-dimethyl-4-hydroxymethyl)phenol and 200 ml of N,N-dimethylformamide. The pressure of the system was reduced to 20 mmHg. In order to dry the reagent, the solvent and the apparatus, 75 vol % (150 ml) of N,N-dimethylformamide which had been previously charged was removed by distillation.

The system was cooled to room temperature. Dried nitrogen was then introduced into the system to release the system from vacuum. 0.7 g of sodium amide was immediately added to the system to initiate ester interchange reaction. In the ester interchange reaction, the system was heated to a temperature of 50° C. to 60° C. under a pressure of 20 mmHg for 3 hours at the first stage and then to a temperature of 60° C. to 80° C. for 20 mmHg with N,N-dimethylformamide being distilled for 3 hours at the second stage.

The reaction mixture was then heated to a temperature of 100° C. to 120° C. under a pressure of 5 mmHg for 3 hours. After the completion of the reaction, the reaction system was then neutralized with diluted hydrochloric acid. To the reaction system was added chloroform. After separation, the material was dehydrated over sodium sulfate anhydride. The organic solvent was then removed from the material under reduced pressure. The material was then subjected to isolation through silica gel column chromatography (solvent: chloroform) to obtain 26.3 g of the desired compound.

(2) Synthesis of Compound (III-b)

Into a 300-ml four-necked flask were charged 27.3 g of (2,6-dimethyl-4-hydroxymethyl)phenol, 9.5 g of 1,2,3-propanetricarboxylic acid, 100 ml of toluene, and 2.7 g of paratoluenesulfonic acid monohydrate. The reaction mixture was heated in a stream of nitrogen under reflux for 2 hours.

After the completion of the reaction, to the reaction product was added diethyl ether. The reaction product was then washed with water. The reaction product was then washed with saturated brine. The reaction product was then dehydrated over sodium sulfate anhydride. The organic solvent was removed from the system under reduced pressure. The material was then subjected to isolation through silica gel chromatography (solvent: chloroform) to obtain 22.8 g of the desired compound.

(3) Synthesis of Compound (III-e)

13 4 g of trimethylolpropane, 43 5 g of p-hydroxybenzoic acid and 5.4 g of P-toluenesulfonic acid as a catalyst were stirred at a temperature of 160° C. for 6 hours to obtain a brown resinous substance. The brown resinous substance was then washed with water to remove the catalyst therefrom. The material was dissolved in acetone. The acetone solution was introduced into water for purification. The material was filtered off, and then dried at a temperature of 40° C. to obtain 31.9 g of the desired compound.

(4) Synthesis of Compound-(III-g)

25.4 g of dipentaerythritol, 82.8 g of p-hydroxybenzoic acid and 10.3 g of P-toluenesulfonic acid as a catalyst were heated to a temperature of 170° C. for 8 hours. The reaction system was then processed in the same manner as in the foregoing Synthesis Example (3) to obtain 54.7 g of the desired compound.

(5) Synthesis of light-sensitive material j

Into a three-necked flask were charged 15.3 g of Compound (III-a) synthesized in Synthesis Example (1), 13.4 g of 1,2-naphthoquinonediazido-5-sulfonyl chloride and 350 ml of acetone to make a uniform solution. To the solution was then gradually added dropwise a mixture of 5.3 g of triethylamine and 50 ml of acetone. The reaction mixture was allowed to undergo reaction at a temperature of 25° C. for 4 hours.

The reaction mixture was then poured into 1,000 ml of a 1% aqueous solution of hydrochloric acid. The resulting precipitate was filtered off, washed with water, and then dried at a temperature of 40° C. to obtain 16.2 g of 1,2-naphthoquinonediazido-5-sulfonic ester of Compound (III-a) (light-sensitive material j).

(6) Synthesis of light-sensitive materials k to m

Light-sensitive materials j to m as set forth in Table 3 were synthesized in the same manner as the light-sensitive material j, except that the esters shown were used. In Table 3, the percent esterification indicates average percent esterification.

TABLE 3

| | Light-sensitive material | |
|---|---|---|
| No. | Kind | % Esterification |
| k | 1,2-Naphthoquinonediazido-5-sulfonic ester of Compound (I-b) | 70 |
| l | 1,2-Naphthoquinonediazido-5-sulfonic ester of Compound (I-e) | 75 |
| m | 1,2-Naphthoquinonediazido-5-sulfonic ester of Compound (I-g) | 75 |

(7) Synthesis of light-sensitive material n

Into a three-necked flask were charged 11.5 g of 2,3,4-trihydroxybenzophenone, 30.2 g of 1,2-naphthoquinonediazido-5-sulfonyl chloride and 300 ml of acetone to make a uniform solution. To the solution was then gradually added dropwise a mixture of 11.4 g of triethylamine and 50 ml of acetone. The reaction mixture was allowed to undergo reaction at a temperature of 25° C. for 3 hours.

The reaction mixture was then poured into 1,500 ml of a 1% aqueous solution of hydrochloric acid. The resulting precipitate was filtered off, washed with water, and then dried at a temperature of 40° C. to obtain 29.8 g of 1,2-naphthoquinonediazido-5-sulfonic ester of 2,3,4-trihydroxybenzophenone (light-sensitive material n).

(8) Synthesis of light-sensitive material o

Into a three-necked flask were charged 12.3 g of 2,3,4,4'-tetrahydroxybenzophenone, 40.3 g of 1,2-naphthoguinonediazido-5-sulfonyl chloride and 300 ml of acetone to make a uniform solution. To the solution was then gradually added dropwise a mixture of 15.2 g of triethylamine and 50 ml of acetone. The reaction mixture was allowed to undergo reaction at a temperature of 25° C. for 3 hours.

The reaction mixture was then poured into 1,500 ml of a 1% aqueous solution of hydrochloric acid. The resulting precipitate was filtered off, washed with water, and then dried at a temperature of 40° C. to obtain 39.7 g of 1,2-naphthoquinonediazido-5-sulfonic ester of 2,3,4,4'-tetrahydroxybenzophenone (light-sensitive material o).

(9) Preparation and evaluation of positive type photoresist composition 1.3 g of each of the light-sensitive material j to o obtained in Synthesis Examples (5) to (8), respectively, and 5 g of the cresol novolak resin (molecular weight: 7,100) obtained in the step (7) of Example 1 were dissolved in 15 g of ethyl cellosolve acetate. The material was filtered through a microfilter having a pore diameter of 0.2 μm to prepare a photoresist composition. The photoresist composition was coated on a silicon wafer by a spinner, and then dried by a vacuum hot plate at a temperature of 100° C. for 90 seconds to obtain a resist film having a thickness of 1 2 μm.

The resist film was exposed to light by means of a reduction projection exposing apparatus FPA-1550 available from Cannon Inc., developed with a 2.38% aqueous solution of tetramethyl ammonium hydroxide for 1 minutes, washed with water for 30 seconds, and then dried.

The resist pattern thus formed on the silicon wafer was observed under a scanning type electron microscope for evaluation. The results are set forth in Table 4.

Relative sensitivity is defined as the reciprocal of the exposure reproducing a 0.70 μm mask pattern, represented relative to the value of Comparative Example 5.

The percent film remaining, the resolving power, the heat resistance and the resist shape were evaluated in the same manner as in Example 1.

TABLE 4

| Example No. | Light-sensitive material | Relative sensitivity | % Film remaining | Resolving power (μm) | Heat resistance (°C.) | Resist shape (θ) |
|---|---|---|---|---|---|---|
| Example | | | | | | |
| 6 | j | 1.4 | 100 | 0.50 | 160 | 88 |
| 7 | k | 1.3 | 100 | 0.50 | 160 | 89 |
| 8 | l | 1.3 | 100 | 0.50 | 160 | 88 |
| 9 | m | 1.3 | 100 | 0.50 | 160 | 89 |
| Comparative Example | | | | | | |
| 5 | n | 1.0 | 98 | 0.60 | 140 | 84 |
| 6 | o | 1.1 | 98 | 0.55 | 140 | 83 |

The results show that the resists comprising the light-sensitive materials j, k, l, and m of the present invention were excellent particularly in resolving power and resist shape.

The light-sensitive materials j to m of the present invention were excellent in solubility in ethylene glycol monomethyl ether acetate. The resist composition solutions comprising these light-sensitive materials showed no precipitation even after storage at a temperature of 40° C. for 50 days, while the resist composition solutions comprising the comparative light-sensitive materials n and o showed some precipitation under the same conditions.

While the invention has been described in detail and with reference to specific embodiments thereof, it will be apparent to one skilled in the art that various changes and modifications can be made therein without departing from the spirit and scope thereof.

What is claimed is:

1. A positive type photoresist composition comprising an admixture of a 1,2-naphthoquinonediazido-5-(and/or -4-)-sulfonic ester of a polyhydroxy compound represented by the following formula (I), (II) or (III) and an alkali soluble resin:

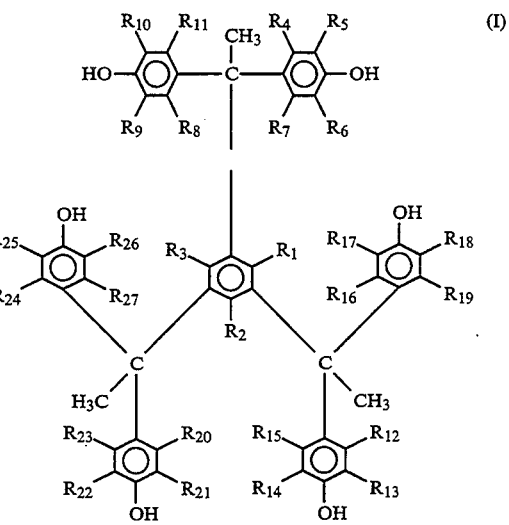

wherein $R_1$ to $R_{27}$, which may be the same or different, each represents a hydrogen atom, a hydroxyl group, a halogen atom, an alkyl group, an alkoxy group, a nitro group, an alkenyl group, an aryl group, an aralkyl group, an alkoxycarbonyl group, an arylcarbonyl group, an acyloxy group, an acyl group, an aryloxy group or an aralkoxy group;

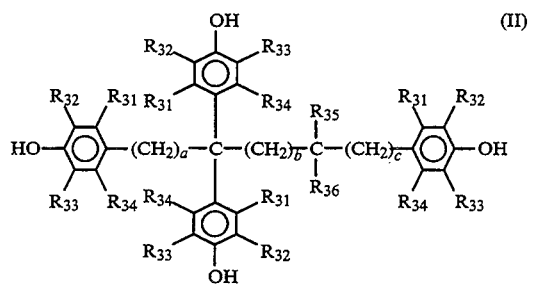

wherein $R_{31}$ to $R_{34}$, which may be the same or different and in which the four groups for each of $R_{31}$ to $R_{34}$ may be the same or different, each represents a hydrogen atom, a hydroxyl group, a halogen atom, an alkyl group, an alkoxy group or an alkenyl group; $R_{35}$ and $R_{36}$ represents a hydrogen atom, an alkyl group or

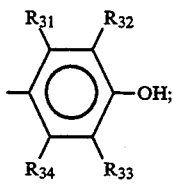

a and c each represents 0 or 1; and b

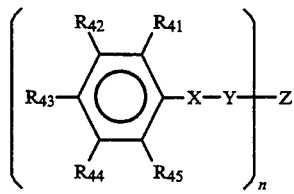

wherein $R_{41}$ to $R_{45}$, which may be the same or different, each represents a hydrogen atom, a hydroxyl group, a halogen atom, an alkyl group or an alkoxy group, with the proviso that at least one of $R_{41}$ to $R_{45}$ is a hydroxyl group; X represents a single bond or a $-(CH_2)_m-$ group; Y represents a $-COO-X-$ or $-OCO-X-$ group; Z represents an organic group having a valence of n; n represents an integer 3 to 6; and m represents n integer 1 to 4.

2. The positive type photoresist composition of claim 1, wherein the polyhydroxy compound is according to formula (I).

3. The positive type photoresist composition of claim 1, wherein the polyhydroxy compound is according to formula (II).

4. The positive type photoresist composition of claim 1, wherein the polyhydroxy compound is according to formula (III).

5. The positive type photoresist composition of claim 1, wherein the ester is present in an amount of 5 to 100 parts by weight based on 100 parts by weight of the alkali-soluble resin.

6. The positive type photoresist composition of claim 1, wherein the ester is present in an amount of 10 to 50 parts by weight based on 100 parts by weight of the alkali-soluble resin.

7. The positive type photoresist composition of claim 1, wherein the ester is a 1, 2-naphthoquinonediazide-4-sulfonic ester.

8. The positive type photoresist composition of claim 1, wherein the ester is a 1, 2-naphthoquinonediazide-5-sulfonic ester.

9. The positive type photoresist composition of claim 1, wherein the alkali-soluble resin ia a novolak resin.

* * * * *